(12) United States Patent
Hsiao et al.

(10) Patent No.: US 9,795,052 B2
(45) Date of Patent: Oct. 17, 2017

(54) HANDLE STRUCTURE AND SERVER USING THE SAME

(71) Applicant: SilverStone Technology Co., Ltd., New Taipei (TW)

(72) Inventors: Chun-Lan Hsiao, New Taipei (TW); Hsin-Hung Chen, New Taipei (TW); Chih-Chiang Chang, New Taipei (TW)

(73) Assignee: SILVERSTONE TECHNOLOGY CO., LTD., New Taipei (TW)

( * ) Notice: Subject to any disclaimer, the term of this patent is extended or adjusted under 35 U.S.C. 154(b) by 0 days.

(21) Appl. No.: 14/992,192

(22) Filed: Jan. 11, 2016

(65) Prior Publication Data

US 2017/0079156 A1 Mar. 16, 2017

(30) Foreign Application Priority Data

Sep. 10, 2015 (TW) .............................. 104214685 U

(51) Int. Cl.
*H05K 7/14* (2006.01)
*H05K 5/02* (2006.01)
*H05K 7/18* (2006.01)

(52) U.S. Cl.
CPC ........... *H05K 7/1488* (2013.01); *H05K 5/023* (2013.01); *H05K 7/1489* (2013.01); *H05K 7/18* (2013.01)

(58) Field of Classification Search
CPC ... Y10T 16/458; Y10T 16/459; Y10T 16/469; Y10T 16/4707; Y10T 16/4713; H05K 5/023; H05K 7/1489; H05K 5/0221; H05K 7/1409; H05K 7/14; H05K 7/1488; H05K 7/18; Y10S 292/37; Y10S 292/63; E05C 3/14; E05B 65/46; G06F 1/1624; G06F 1/166
USPC ..... 361/679.59, 679.58, 724, 726, 727, 725, 361/679.39; 312/332.1, 330.1, 333, 312/334.1, 334.8, 223.1, 334.46, 223.2; 292/210, 121, 126, 194, 200, 99, 100, 95, 292/96; 439/160; 16/415; 211/26; 248/222.11, 222.13, 229.12, 245
See application file for complete search history.

(56) References Cited

U.S. PATENT DOCUMENTS

| 5,820,175 A * | 10/1998 | Clavin .................... E05C 1/145 292/153 |
| 6,181,549 B1 * | 1/2001 | Mills .................... H05K 7/1489 292/114 |
| 6,185,106 B1 * | 2/2001 | Mueller ............... H05K 7/1409 361/754 |

(Continued)

*Primary Examiner* — Stanton L Krycinski
*Assistant Examiner* — Hiwot Tefera
(74) *Attorney, Agent, or Firm* — Chun-Ming Shih; HDLS IPS Services

(57) ABSTRACT

A handle structure includes a holding member, a press member, and a hook. The holding member includes a holding portion and a space formed in the holding portion. The press member includes a press portion and a plurality of adjustment holes. The press portion is movably disposed in the space. The adjustment holes are disposed on the other end of the press member opposite to the press portion. The hook includes a clasp portion and at least one fastening hole. The fastening hole is adjustably positioned corresponding to any of the adjustment holes, and the clasp portion is movable along with the movement of the press portion, wherein the clasp portion protrudes out of the holding member. The hook moves by pressing the press portion.

18 Claims, 13 Drawing Sheets

(56) References Cited

U.S. PATENT DOCUMENTS

| | | | | |
|---|---|---|---|---|
| 6,203,075 B1* | 3/2001 | Wells, Jr. | ............... | B65D 45/24 |
| | | | | 292/100 |
| 6,257,439 B1* | 7/2001 | Hsu | ...................... | A47J 45/061 |
| | | | | 16/425 |
| 6,547,289 B1* | 4/2003 | Greenheck | ............. | E05B 65/46 |
| | | | | 292/100 |
| 6,957,979 B2* | 10/2005 | Welsh | .................. | H05K 7/1409 |
| | | | | 439/545 |
| 7,633,760 B2* | 12/2009 | Wu | ........................ | G06F 1/182 |
| | | | | 361/679.02 |
| 7,944,691 B1* | 5/2011 | Pounds | ................... | G06F 1/187 |
| | | | | 361/679.37 |
| 8,369,087 B2* | 2/2013 | Wu | ........................ | G06F 1/181 |
| | | | | 361/679.58 |
| 8,727,138 B2* | 5/2014 | Dittus | ................. | H05K 7/1489 |
| | | | | 211/26 |
| 2002/0182896 A1* | 12/2002 | Welsh | ................. | H05K 7/1409 |
| | | | | 439/1 |
| 2011/0309730 A1* | 12/2011 | Retchloff | ................. | E05C 3/14 |
| | | | | 312/332.1 |
| 2013/0241378 A1* | 9/2013 | Zhang | ................. | H05K 5/0221 |
| | | | | 312/223.2 |
| 2014/0187068 A1* | 7/2014 | Chia | .................... | H05K 7/1489 |
| | | | | 439/160 |
| 2015/0250312 A1* | 9/2015 | Barrett | ............... | A47B 88/0414 |
| | | | | 312/319.1 |
| 2016/0150659 A1* | 5/2016 | Chen | ................... | H05K 7/1487 |
| | | | | 312/223.2 |

* cited by examiner

HANDLE STRUCTURE AND SERVER USING THE SAME

TECHNICAL FIELD

The present invention relates to a handle structure and, in particular, to a handle structure for easy operation and a server using the handle structure.

BACKGROUND

In recent years, along with the development of the information technology, e-business has become the trend. Since personal computers cannot fully meet the requirements in e-business, so servers with excellent operational functions are provided to satisfy the requirements in e-business. Furthermore, since there has been a trend toward miniaturization of products, the conventional large vertical server which occupies a large space has been gradually developed into a rack server as small as one or two rack units in height (i.e. 1U or 2U in height, 1U refers to 4.445 cm) for accommodating a chassis for centralization of management.

Generally speaking, the rack server receives computers by means of chassis slidably disposed in a server cabinet. Currently, in order to facilitate withdrawal or replacement of the chassis, the chassis is fixed by means of screws fastened on two outer sides of the chassis. However, since the chassis is fixed simply by screw fastening, when removing the chassis from the rack, screws have to be unfastened one by one, which is inconvenient and time-consuming. There is another kind of chassis which is fixed to the rack by means of an engagement structure, although it saves time and labor in unfastening the screws, this engagement structure cannot be applied to a variety of the rack servers having various heights, which also causes inconvenience.

Accordingly, the inventor made various studies to improve the above-mentioned operation problems, on the basis of which the present invention is accomplished.

SUMMARY

It is an object of the present invention to provide a handle structure facilitating easy operation and having a length-adjustable hook.

It is another object of the present invention to provide a server which facilitates easy withdrawal of a chassis and facilitates engaging a rack.

Accordingly, the present invention provides a handle structure including a holding member, a press member, and a hook. The holding member includes a holding portion and a space formed in the holding portion. The press member includes a press portion and a plurality of adjustment holes. The press portion is movably disposed in the space, wherein each of the adjustment holes is disposed on an end of the press member opposite to the press portion. The hook includes a clasp portion and at least one fastening hole. The fastening hole is adjustably positioned corresponding to any of the adjustment holes, and the clasp portion is movable along with the movement of the press portion, wherein the clasp portion protrudes out of the holding member.

In another broad embodiment, the present invention provides a server suitable for use in a rack having a plurality of retaining holes. The server includes a chassis and the handle structure of the above-mentioned embodiment. The chassis is slidably connected to the rack, the chassis includes two slide rails corresponding to each other, and the two slide rails are disposed at two side surfaces of the chassis respectively. The handle structure is fixed to the chassis and is engaged with a corresponding one of the retaining holes.

It is preferable that the handle structure further includes a first fastening element, a second fastening element, and a resilient element. The first fastening element fastens the press member to the holding member, the second fastening element passes through the at least one fastening hole to be positioned in a corresponding one of the adjustment holes, and the resilient element is disposed between the holding member and the press member.

It is preferable that the holding portion further includes two opposite side walls and two assembly holes respectively formed on the two side walls, the press member includes a pivot portion, the pivot portion includes a pivot hole corresponding to the assembly hole, the first fastening element passes through the assembly hole and the pivot hole to fasten the press member, and the space is formed between the two side walls.

It is preferable that the press member further includes a contact block, the contact block is disposed in the space and one end of the contact block is connected to the pivot portion, and each of the adjustment holes is formed on the contact block.

It is preferable that the holding portion further includes a recess, the pivot portion is pivotally connected to the assembly hole of the holding portion, and the recess communicates with the space.

BRIEF DESCRIPTION OF THE DRAWINGS

The disclosure will become more fully understood from the detailed description and the drawings given herein below are for illustration only, and thus do not limit the disclosure, wherein.

DETAILED DESCRIPTION

Detailed descriptions and technical contents of the present invention are illustrated below in conjunction with the accompany drawings. However, it is to be understood that the descriptions and the accompany drawings disclosed herein are merely illustrative and exemplary and not intended to limit the scope of the present invention.

Figure 1:
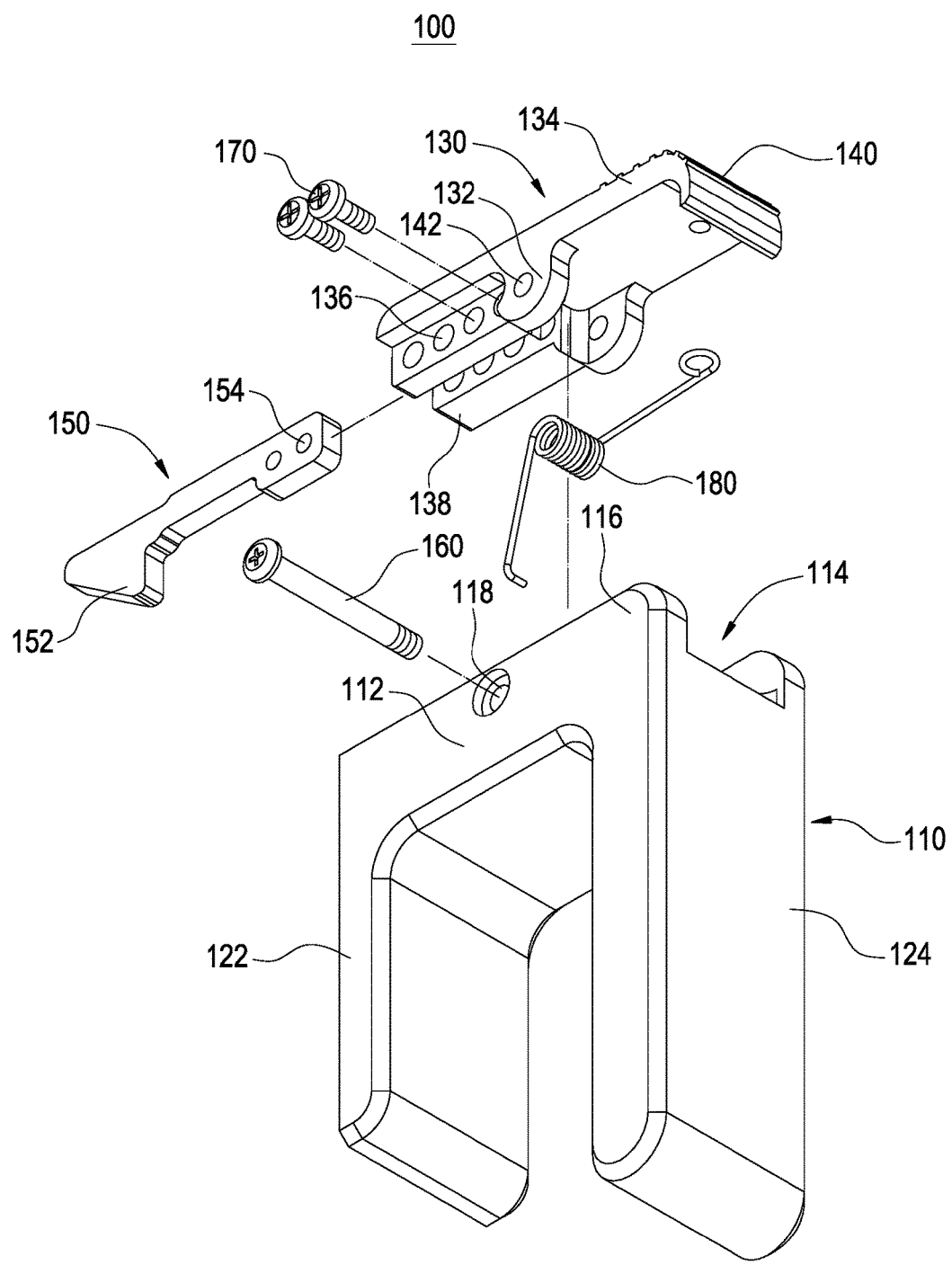
FIG. 1 is an exploded view of a handle structure according to a first embodiment of the present invention.
Figure 2:
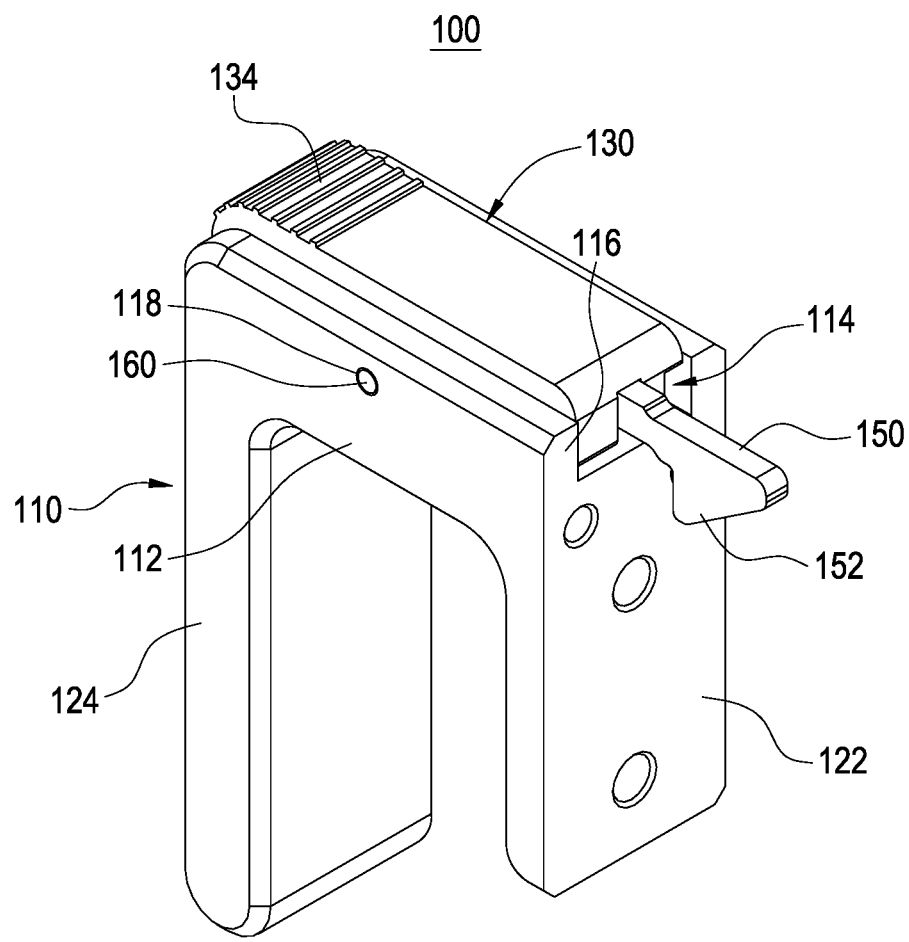
FIG. 2 is a perspective view of the handle structure according to the first embodiment of the present invention.
Figure 3:
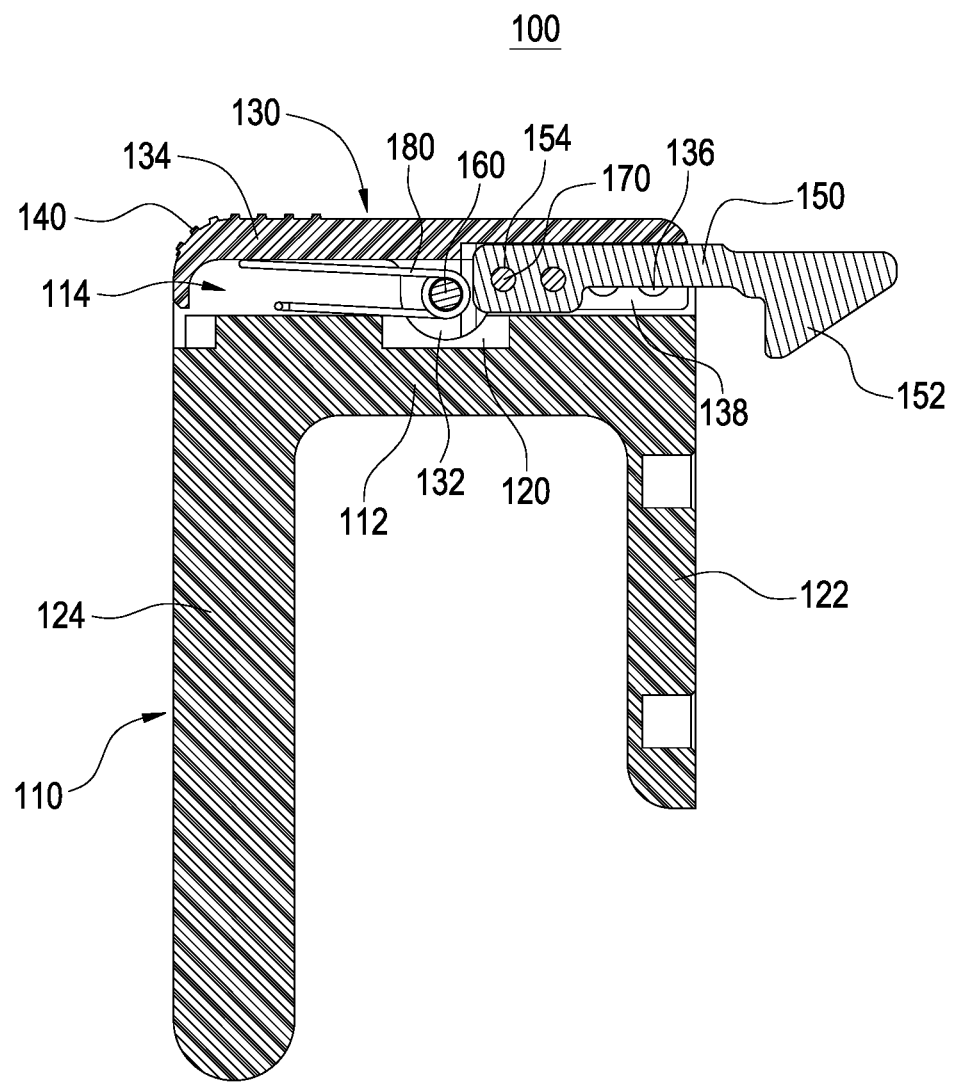
FIG. 3 is a cross-sectional view of the handle structure according to the first embodiment of the present invention.

Referring to FIGS. 1 to 3, the present invention provides a handle structure 100 which includes a holding member 110, a press member 130, and a hook 150. The holding member 110 includes a holding portion 112 and a space 114 formed in the holding portion 112. The press member 130 includes a press portion 134 and a plurality of adjustment holes 136, the press portion 134 is movably disposed in the space 114, wherein each of the adjustment holes 136 is disposed on the other end of the press member 134 opposite to the press portion 134. The hook 150 includes a clasp portion 152 and at least one fastening hole 154. The fastening hole 154 is adjustably positioned corresponding to any of the adjustment holes 136, the clasp portion 152 is movable along with the movement of the press portion 134, wherein the clasp portion 152 protrudes out of the holding member 110.

In the present embodiment, the handle structure 100 further includes a first fastening element 160, a second fastening element 170, and a resilient element 180. The first fastening element 160 fastens the press member 130 to the holding member 110. The second fastening element 170 passes through the at least one fastening hole 154 and a corresponding one of the adjustment holes 136 to fix the hook 150 to the press member 130. The clasp portion 152 of the hook 150 tilts upwards upon pressing the press portion 134. The first fastening element 160 and the second fastening element 170 are screws, bolts, or pins; the present invention is not limited thereto.

The holding portion 110 further includes two opposite side walls 116 and two assembly holes 118 respectively formed on the side walls 116, wherein the space 114 is formed between the two side walls 116. The press member 130 includes a pivot portion 132, and the pivot portion 132 of the press member 130 includes a pivot hole 142 corresponding to the assembly hole 118, so the first fastening element 160 passes through the assembly hole 118 and the pivot hole 142 to fasten the press member 130 to the holding member 110.

Referring to FIG. 3, the holding member 110 further includes a recess 120, a securing portion 122 and a grip portion 124. The recess 120 is formed in the holding portion 112 and communicates with the space 114, so as to allow the pivot portion 132 to be rotatably accommodated in the recess 120. Referring to FIG. 1, the securing portion 122 and the grip portion 124 are vertically connected to two ends of the holding portion 112. The grip portion 124 allows a user to exert force easily. Furthermore, the press member 130 further includes a contact block 138, the contact block 138 is accommodated in the space 114 and abuts the holding portion 112, one end of the contact block 138 is connected to the pivot portion 132, and each of the adjustment holes 136 is formed on the contact block 138. In order to facilitate operation by the user, a surface of the press portion 134 includes a plurality of knurling portions 140.

It should be noted that the press member 130 preferably includes a pair of pivot portions 132 and a pair of contact blocks 138. The two pivot portions 132 are respectively disposed at two sides of the press member 130, and the two contact blocks 138 are respectively disposed at two sides of the press member 130 to enhance the operation stability of the press portion 134. However, in the present embodiment, only one pivot portion 132 and only one contact block 138 are described as an example.

Furthermore, the resilient element 180 is disposed between the holding member 110 and the press member 130 so as to restore the press portion 134 to an original position thereof. When pressing the press portion 134, the press portion 134 rotates about the pivot portion 132 as a center and moves downward toward the inside of the space 114. At this point, the clasp portion 152 of the hook 150 tilts upward along with the other end (the adjustment hole 136) of the press member 130 by means of the lever principle. When the user releases the press portion 134, the resilient element 180 resiliently pushes the press portion 134 to restore it to its original position. At this point, along with the movement of the press portion 134, the clasp portion 152 of the hook 150 is also restored to its original position to be parallel to the press portion 134.

In the present embodiment, the resilient element 180 is preferably a torsion spring. The torsion spring has two flexible arms (not labeled) respectively contact the press portion 134 and the holding portion 112. Since the torsion spring is a conventional technique, descriptions thereof are omitted for brevity. However, in other different embodiment, the resilient element 180 can also be a compression spring (not illustrated), connected to the press portion 134 and the holding portion 112, or other suitable flexible elements; the present invention is not limited thereto. Moreover, the clasp portion 152 includes an inclined surface 156 at one side to facilitate engagement with a corresponding retaining hole (not illustrated).

Figure 4:
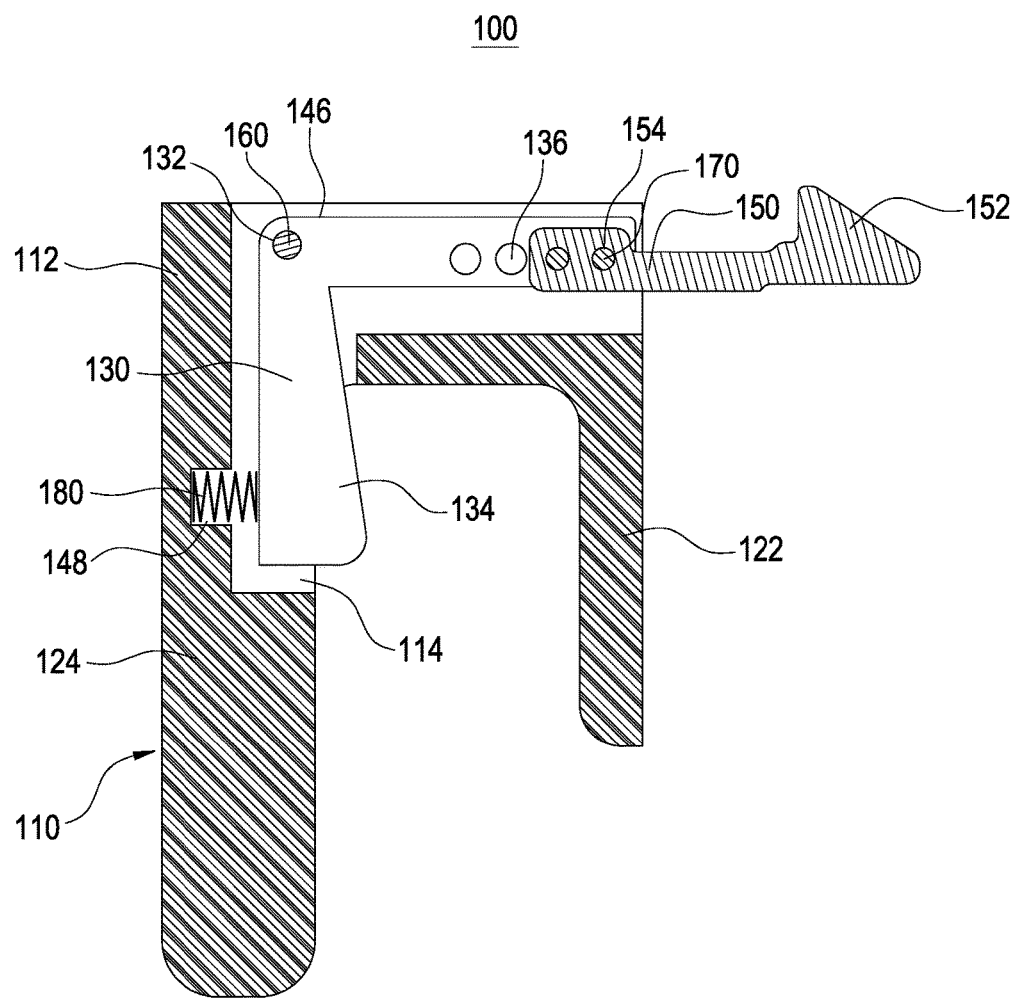
FIG. 4 is a cross-sectional view of the handle structure according to a second embodiment of the present invention.

Please refer to FIG. 4 which is a cross-sectional view according to a second embodiment of the present invention. As shown in FIG. 4, the press portion 134 is preferably disposed between the securing portion 122 and the holding portion 112 or between the securing portion 122 and the grip portion 124, one end of the resilient element 180 is connected to the press portion 134, and the other end of the resilient element 180 is in contact with a recess 148 of the holding portion 112. In the present embodiment, the press member 130 is preferably an L-shaped structure. The L-shaped structure includes a pivot portion 132, the pivot portion 132 is disposed close to a bend portion 146 of the L-shaped structure, and the first fastening element 160 passes through the pivot portion 132 to fix the press member 130 to the holding portion 112.

Figure 5:
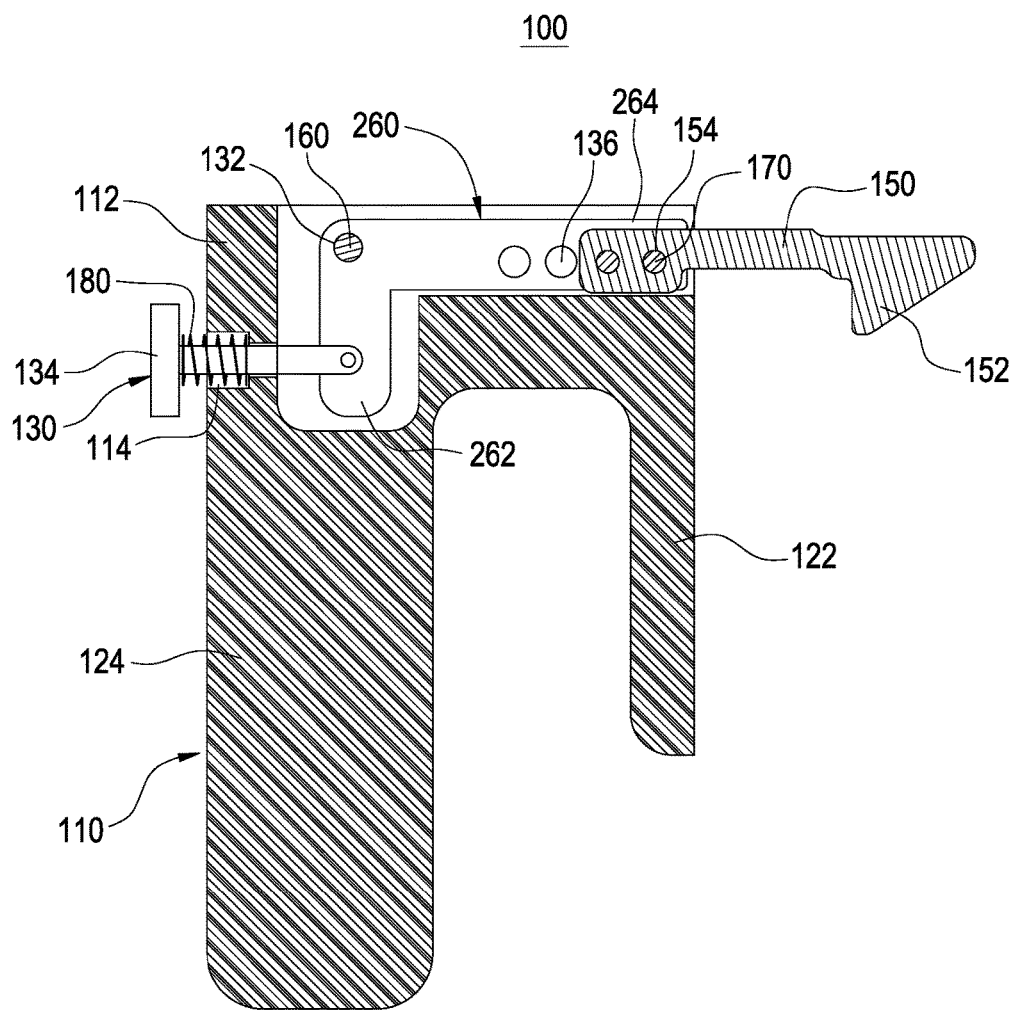
FIG. 5 is a cross-sectional view of the handle structure according to a third embodiment of the present invention.
Figure 6:
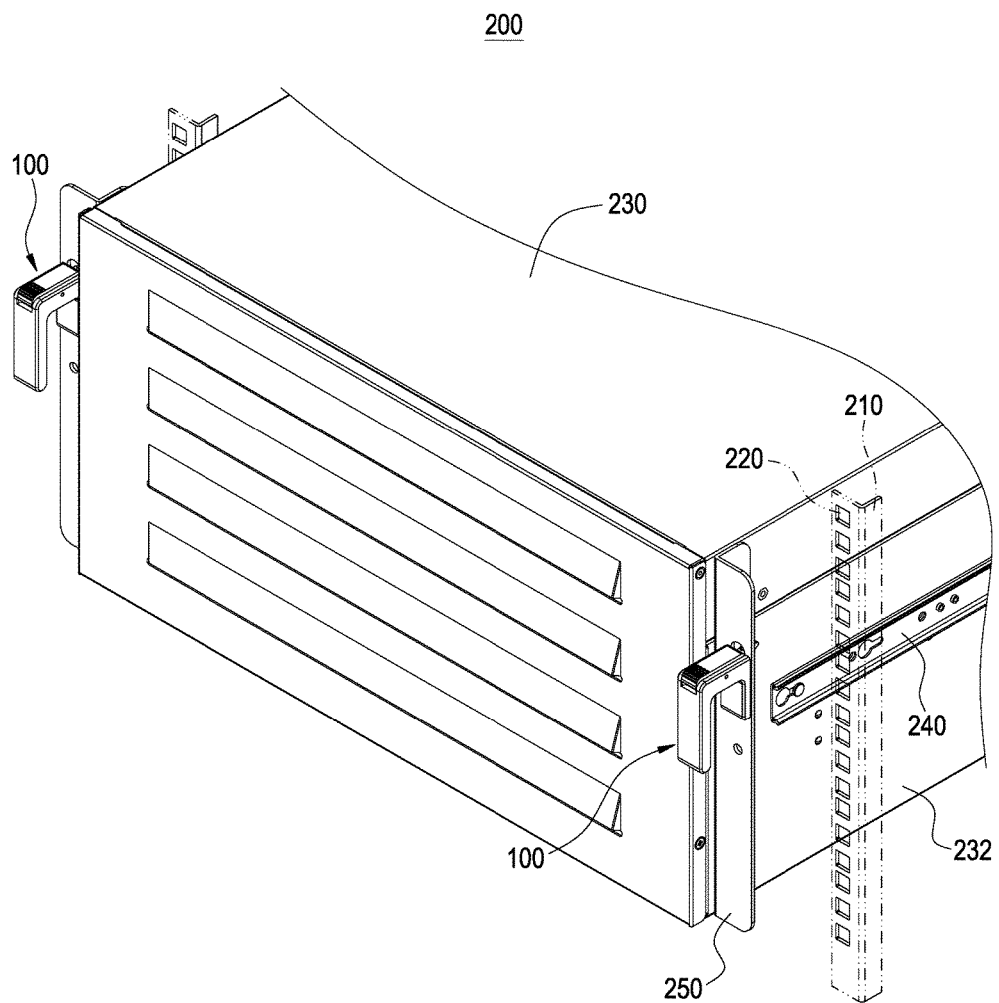
FIG. 6 is a perspective view of the present invention, illustrating a server using the handle structure.
Figure 7:
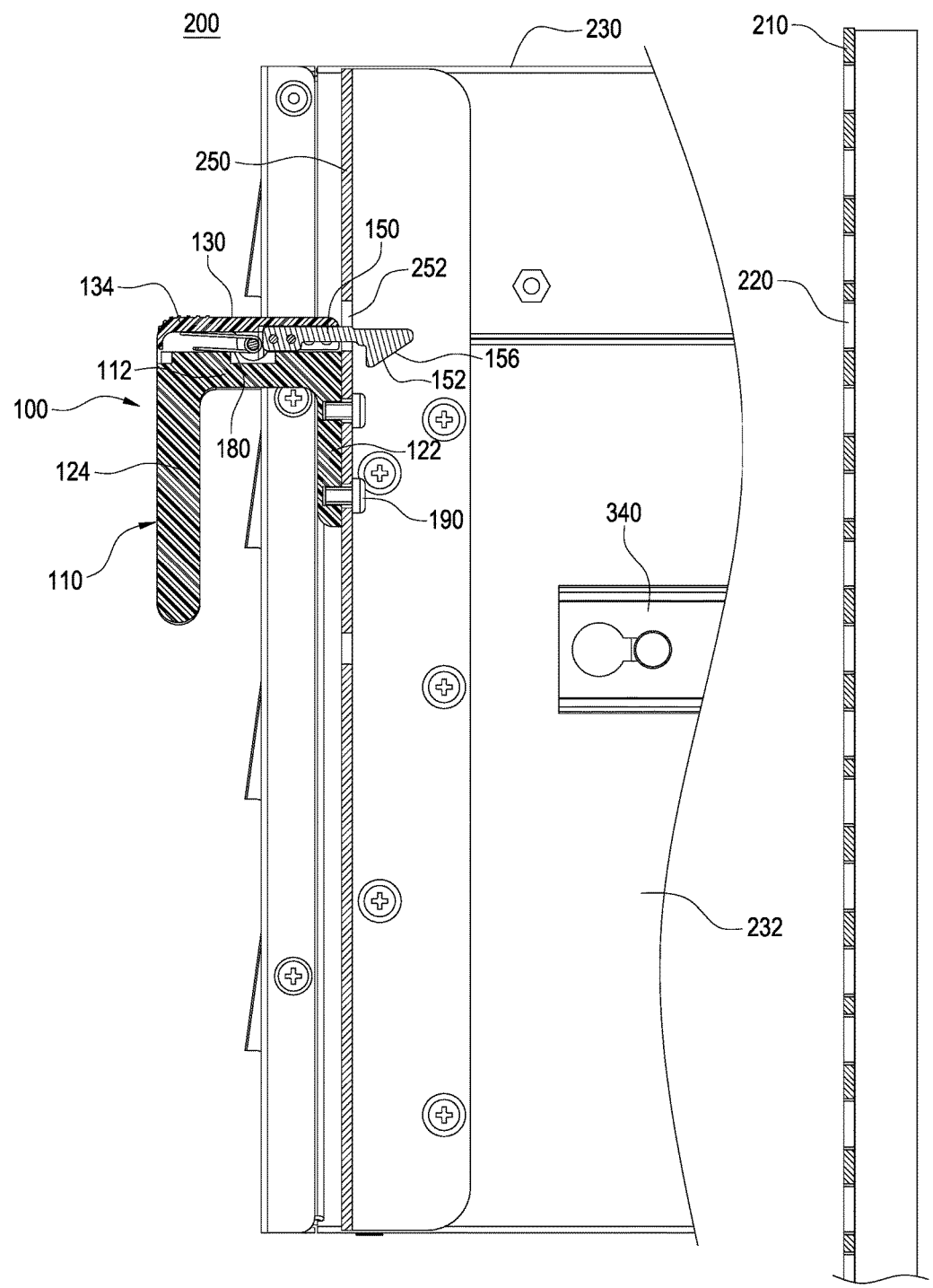
FIG. 7 is a cross-sectional view of the present invention, illustrating the server using the handle structure.

Referring to FIG. 5 which is a cross-sectional view according to a third embodiment of the present invention, the handle structure 100 further includes a connection member 260. The connection member 260 includes a first end 262 and a second end 264, the holding member 110 is connected to the first end 262, the at least one fastening hole 154 of the hook 150 is positioned corresponding to the second end 264, wherein each of the adjustment holes 136 is formed at second end 264. According to the present embodiment, the connection member 260 is preferably an L-shaped structure which includes a pivot portion 132 disposed between the first end 262 and the second end 264. The first fastening element 160 passes through the pivot portion 132 to fix the connection member 260 to the holding portion 112.

In the embodiments of FIGS. 4 and 5, the resilient element 180 is preferably a compression spring. When pushing the press portion 134, the press member 130 rotates about the pivot portion 132 as center, thereby directly driving the clasp portion 152 to move or indirectly driving the clasp portion 152 to move downward or upward via the connection member 260. When the press portion 134 is released, the resilient element 180 resiliently pushes the press portion 134 to restore the press portion 134 to its original position, and the hook 150 also returns to its original position.

It should be noted that, the press member 130 or the connection member 260 includes four adjustment holes 136; the number can vary according to requirement, and the present invention is not limited to any particular number of the adjustment holes 130. The fastening hole 154 of the hook 150 can be fixed to a corresponding one of the adjustment holes 136 by means of the second fastening element 170, so that the clasp portion 152 protrudes from the holding member 110 by an adjustable length.

Referring to FIGS. 6 to 9, the present invention further provides a server 200 suitable for use in a rack 210 having a plurality of retaining holes 220. In the present embodiment, the server 200 includes a chassis 230 and the handle structure 100 of the foregoing embodiments. The chassis 230 is slidably connected to the rack 210, the chassis 230 includes two slide rails 240 corresponding to each other, and the two slide rails 240 are disposed at two side surfaces 232 of the chassis 230. The handle structure 100 is fixed to the chassis 230 and is engaged with a corresponding one of the retaining holes 220 of the rack 210.

As shown in the drawings, the server 200 of the present embodiment further includes a securing plate 250; the securing plate 250 is disposed on one of the side surfaces 232 of the chassis 230, wherein the handle structure 100 is fixed to the chassis 230 by means of the securing plate 250. The securing plate 250 further includes a plate hole 252 corresponding to the retaining hole 220, the clasp portion 152 is inserted through and extends out of the plate hole 252 to be engaged with the retaining hole 220.

Figure 8:
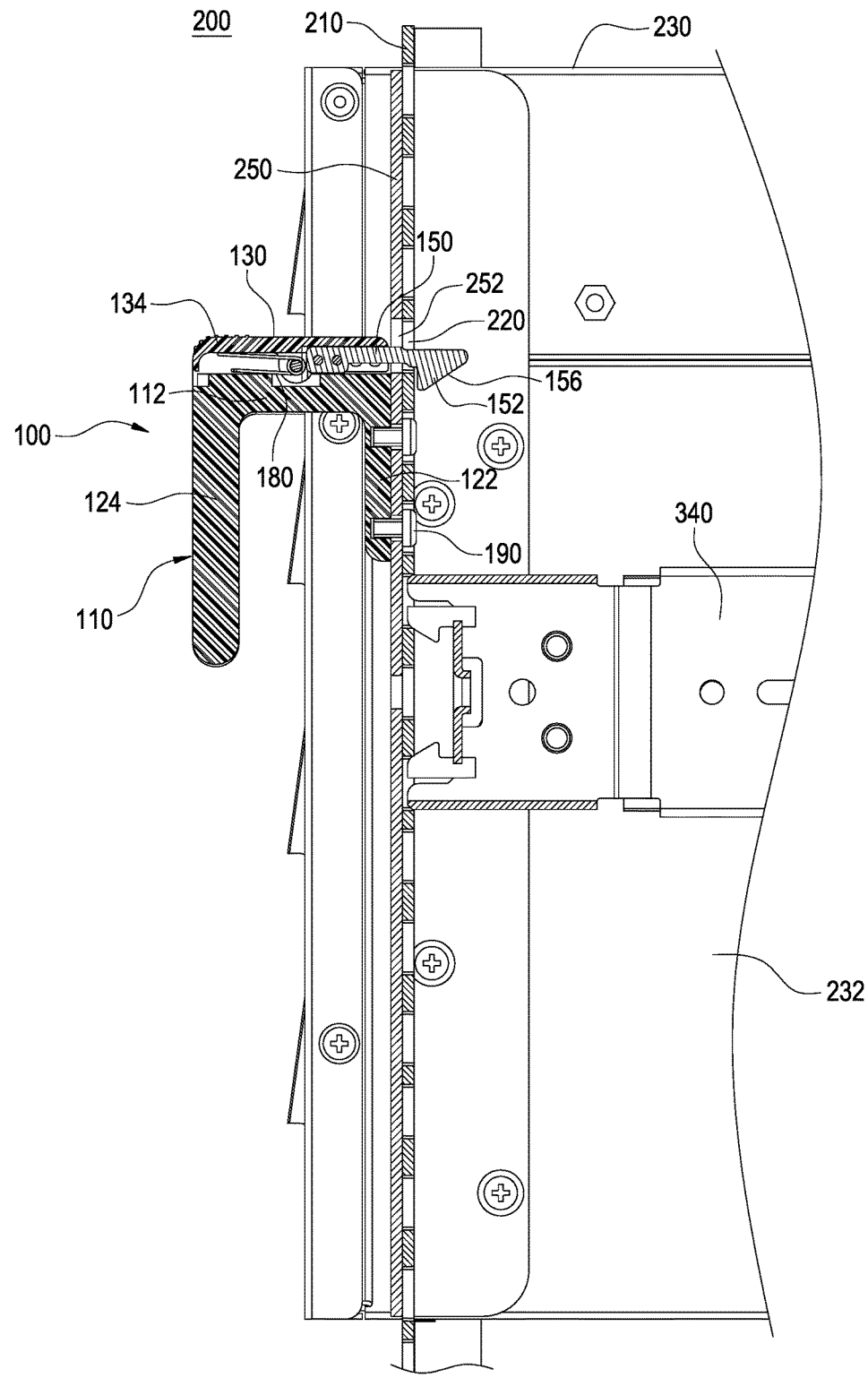
FIG. 8 is a cross-sectional view of the present invention, illustrating that the handle structure is used to push back the chassis and is engaged with the rack.
Figure 9:
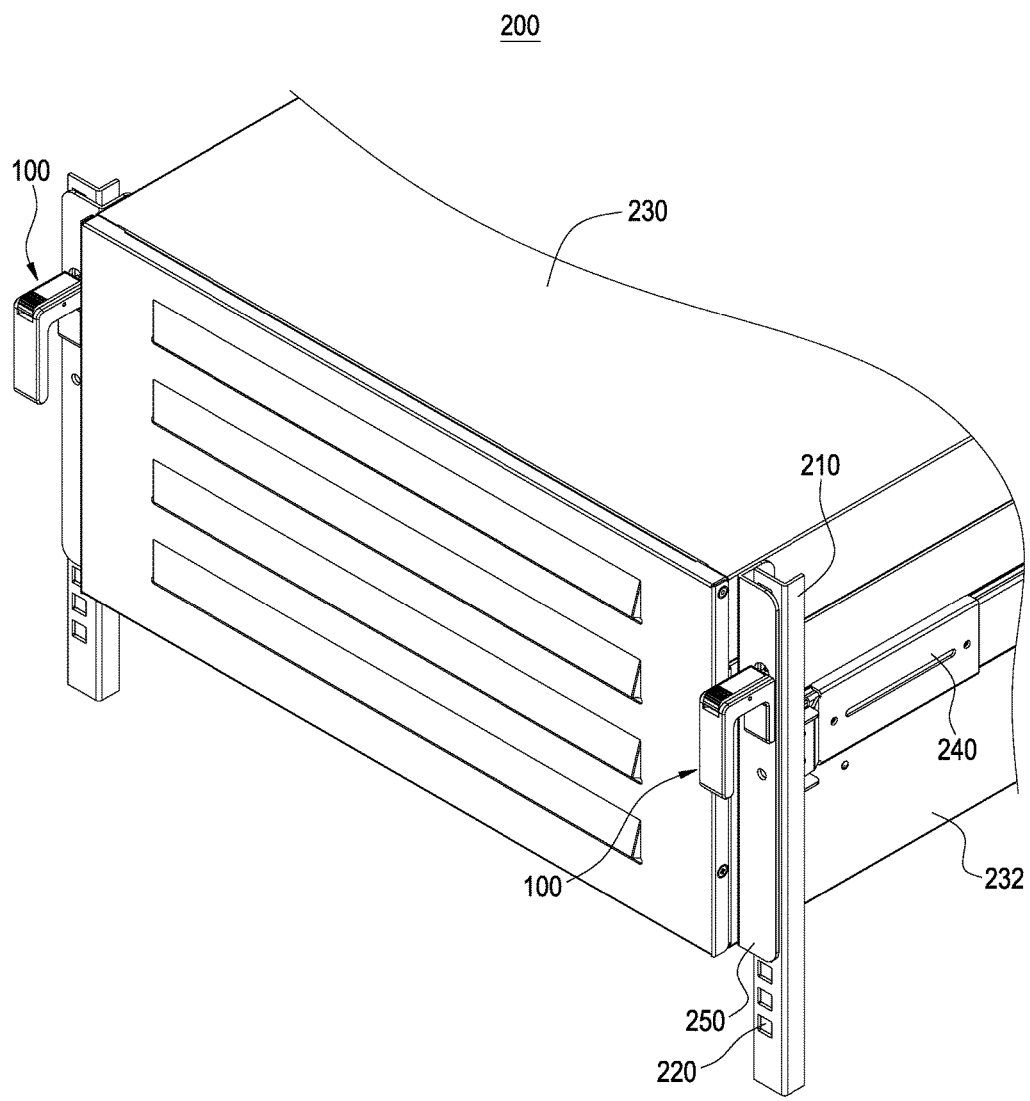
FIG. 9 is a perspective view of the present invention, illustrating that the handle structure is used to push back the chassis and is engaged with the rack.

Referring to FIGS. 8 and 9, in the present embodiment, the server 200 further includes at least one third fastening element 190, the third fastening element 190 passes through the securing plate 250 to fix the securing portion 122. The third fastening element 190 is a screw, a bolt, or a pin.

Figure 10:
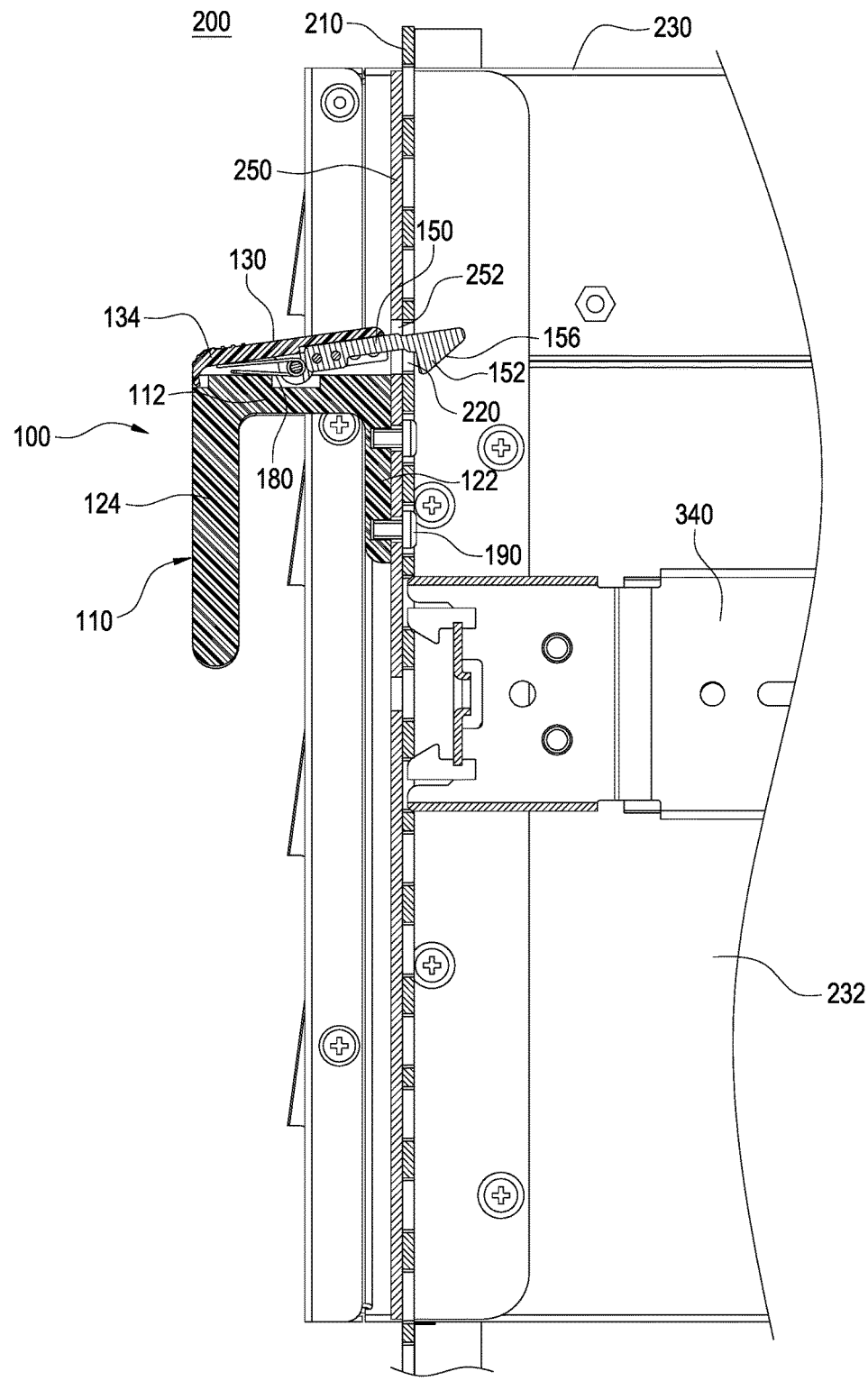
FIG. 10 is a cross-sectional view of the present invention, illustrating separating the handle structure from the rack to pull out the chassis.

Referring to FIG. 10, when pressing the press portion 134, the clasp portion 152 tilts upward along with the press member 130 to be separated from the retaining hole 220 of the rack 210. At this point, the user can exert a force on the grip portion 124 of the holding member 110 to pull out the chassis 230 from the rack 210. On the contrary, when the user pushes the chassis 230 back to the rack 210, an inclined surface 156 of the clasp portion 152 at one side is resiliently engaged with a corresponding retaining hole 220 to accomplish engagement with the rack 210.

Figure 11:
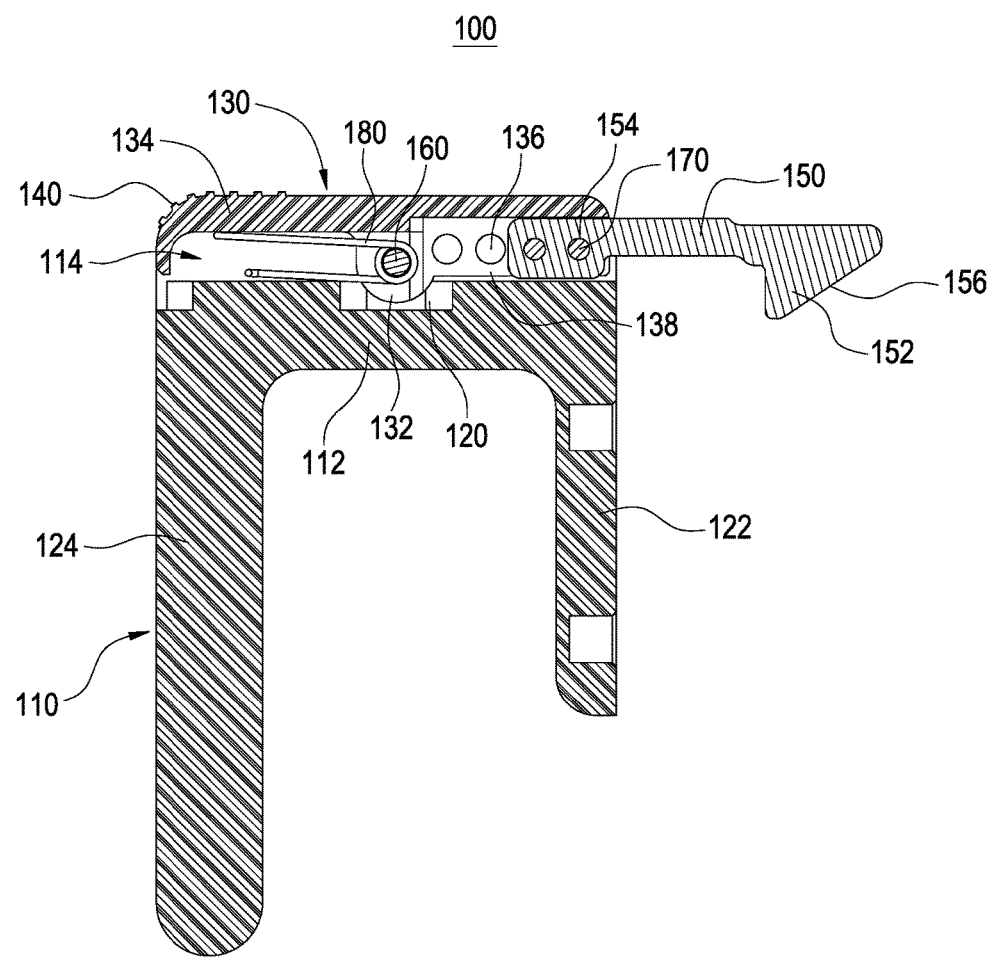
FIG. 11 is a cross-sectional view of the present invention, illustrating adjusting a protruding length of a clasp portion of the handle structure.
Figure 12:
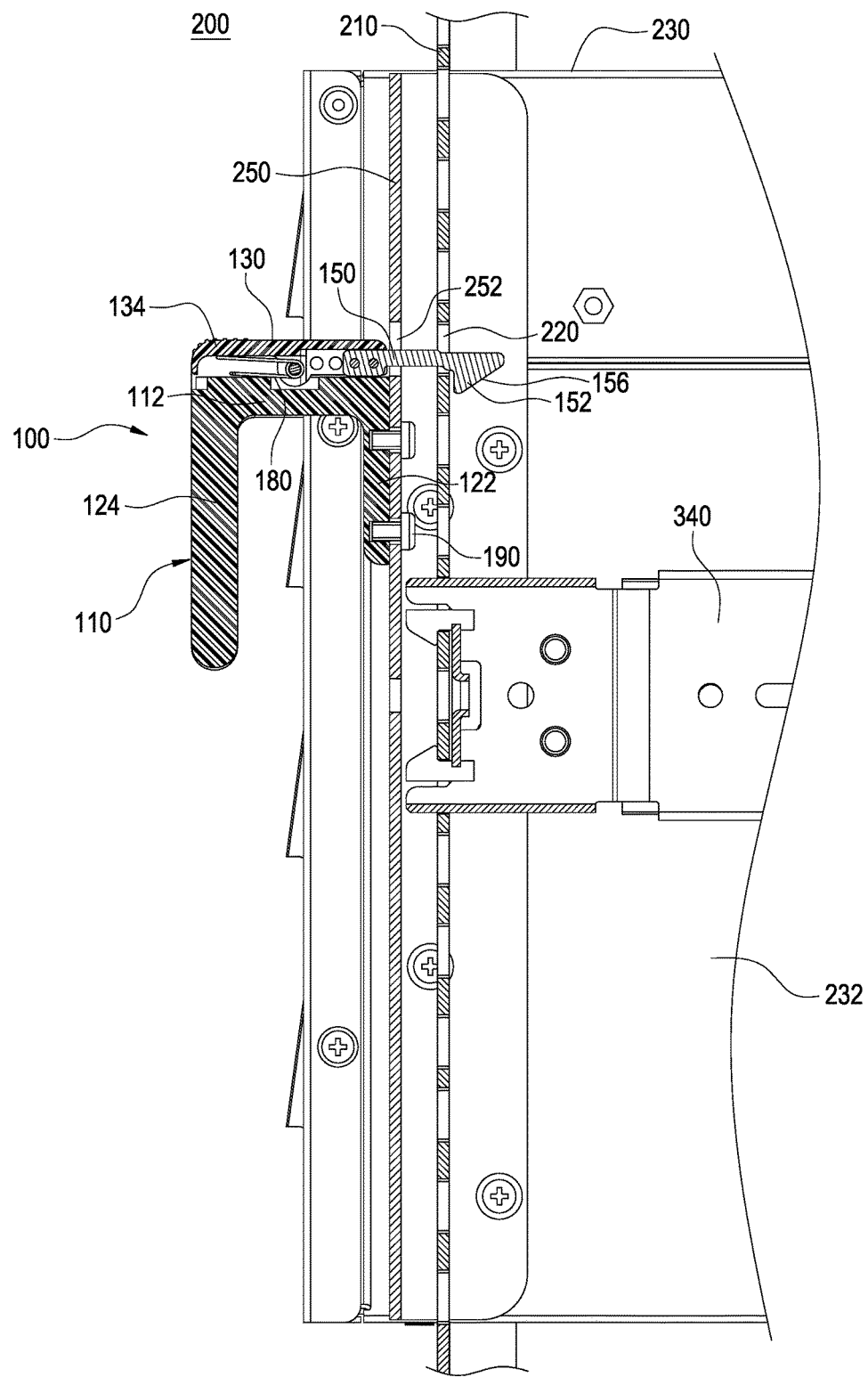
FIG. 12 is another cross-sectional view of the present invention, illustrating the server engaged with the rack by means of the handle structure.
Figure 13:
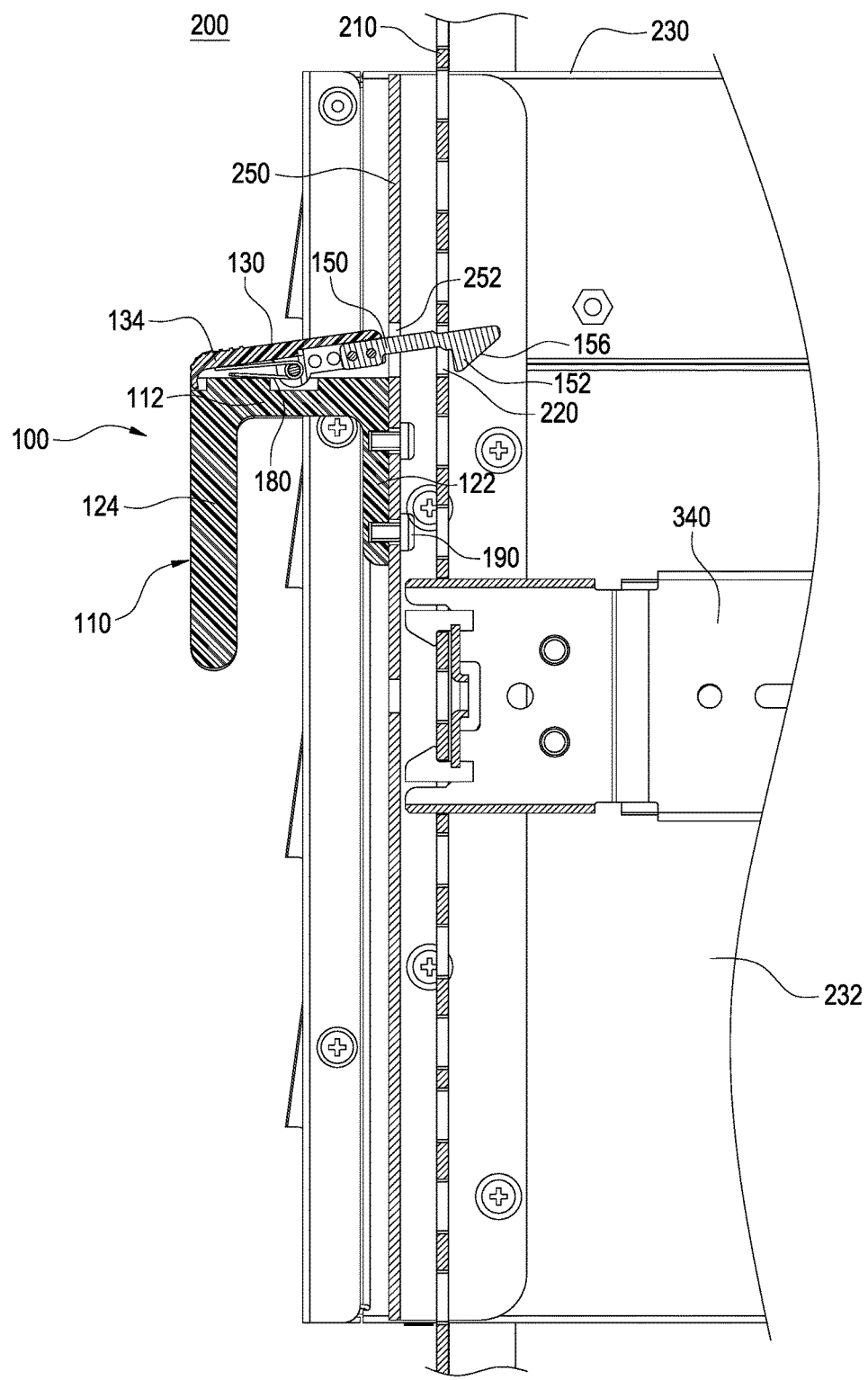
FIG. 13 is a cross-sectional view of the present invention, illustrating separating the handle structure from the rack to pull out the chassis.

Referring to FIGS. 11 to 13, due to the arrangement of the slide rail 240, different specifications of the rack 210, or other reasons, a distance between the chassis 230 and the retaining hole 220 of the rack 210 is different. Therefore, a protruding length of the clasp portion 152 has to be adjusted properly. As shown in the drawings, the user can easily detach the second fastening element 170 to adjust the hook 150 to be fastened to an appropriate adjustment hole 136, so that the clasp portion 152 protrudes from the holding member 110 by a length longer than that in the foregoing embodiments.

Referring to FIGS. 12 and 13, the clasp portion 152 can be engaged with a corresponding retaining hole 220 of the rack 210, so as to limit relative movement between the chassis 230 and the rack 210. The operation details are described in the foregoing embodiments, so the description thereof is omitted herein for brevity.

It is to be understood that the above descriptions are merely the preferable embodiments of the present invention and are not intended to limit the scope of the present invention. Equivalent changes and modifications made in the spirit of the present invention are regarded as falling within the scope of the present invention.

What is claimed is:

1. A handle structure for use with a server in a rack, comprising:
   a holding member including a holding portion and a space formed in the holding portion;
   a press member including a press portion, a pivot portion, and a plurality of adjustment holes arranged along an extension direction of the press portion, the pivot portion including two pivot holes to be pivotally engaged with the holding member, the press portion being movably disposed in the space, wherein each of the adjustment holes is disposed on an end of the press member opposite to the press portion; and
   a hook including a clasp portion and at least one fastening hole, the at least one fastening hole being adjustably positioned corresponding to any of the adjustment holes, such that the hook is non-rotatable relative to the press member, the clasp portion being movable along with the movement of the press portion, wherein the clasp portion protrudes out of the holding member.

2. The handle structure of claim 1, further comprising a first fastening element, a second fastening element, and a resilient element, the press member being fastened to the holding member by the first fastening element, the second fastening element being passed through the at least one fastening hole to be positioned in a corresponding one of the adjustment holes, the resilient element being disposed between the holding member and the press member.

3. The handle structure of claim 2, wherein the holding portion further includes two opposite side walls and two assembly holes respectively formed on the side walls, the two pivot holes corresponding to the two assembly holes, the first fastening element being passed through the two assembly holes and the two pivot holes to fasten the press member, and the space is formed between the two side walls.

4. The handle structure of claim 3, wherein the press member further includes a contact block, the contact block is disposed in the space, one end of the contact block is connected to the pivot portion, and each of the adjustment holes is formed on the contact block.

5. The handle structure of claim 3, wherein the holding portion further includes a recess, the pivot portion is pivotally connected to the holding portion by the two assembly holes, and the recess communicates with the space.

6. The handle structure of claim 2, wherein the holding member further includes a securing portion and a grip portion, and the securing portion and the grip portion are connected to two ends of the holding portion respectively.

7. The handle structure of claim 2, wherein the press portion is disposed between a securing portion and the holding portion, one end of the resilient element is connected to the press portion, and the other end of the resilient element is in contact with a recess of the holding portion.

8. The handle structure of claim 7, wherein the press member is an L-shaped structure, the L-shaped structure includes the pivot portion, the pivot portion is disposed close to a bend portion of the L-shaped structure, and the first fastening element being passed through the pivot portion to fix the press member to the holding portion.

9. The handle structure of claim 2, wherein the first fastening element and the second fastening element are screws, bolts, or pins.

10. The handle structure of claim 2, wherein the resilient element is a torsion spring or a compression spring to restore the press portion to an original position thereof.

11. The handle structure of claim 1, wherein a surface of the press portion includes a plurality of knurling portions.

12. The handle structure of claim 1, wherein the hook includes an inclined surface at one side.

13. A rack having a plurality of retaining holes, comprising:
   a server having a chassis slidably connected to the rack, the chassis including two slide rails corresponding to each other, the two slide rails are disposed at two side surfaces of the chassis respectively, and
   the handle structure of claim 1, the handle structure is fixed to the chassis and is engaged with a corresponding one of the retaining holes.

14. The rack of claim 13, further comprising a securing plate, the securing plate being disposed on one of the side surfaces of the chassis, wherein the handle structure is fixed to the chassis by means of the securing plate.

15. The rack of claim 14, wherein the securing plate further includes a plate hole corresponding to the retaining hole, the clasp portion is inserted through and extends out of the plate hole.

16. The rack of claim 14, further comprising at least one third fastening element, the at least one third fastening element being passed through the securing plate to fix a securing portion.

17. The rack of claim 16, wherein the at least one third fastening element is a screw, a bolt, or a pin.

18. The rack of claim 13, wherein the hook is correspondingly engaged with the retaining hole to limit relative movement between the chassis and the rack.

* * * * *